(12) United States Patent
Akutsu et al.

(10) Patent No.: US 9,159,613 B2
(45) Date of Patent: Oct. 13, 2015

(54) NON-VOLATILE MEMORY DEVICE, METHOD FOR FABRICATING PATTERN ON WAFER AND METHOD FOR MANUFACTURING NON-VOLATILE MEMORY DEVICE USING SAME

(71) Applicant: Kabushiki Kaisha Toshiba, Minato-ku (JP)

(72) Inventors: Yoshihiro Akutsu, Mie-ken (JP); Masaru Kidoh, Mie-ken (JP); Tsuneo Uenaka, Mie-ken (JP); Tadashi Iguchi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/203,853

(22) Filed: Mar. 11, 2014

(65) Prior Publication Data

US 2015/0061068 A1 Mar. 5, 2015

(30) Foreign Application Priority Data

Aug. 27, 2013 (JP) ................................. 2013-175485

(51) Int. Cl.
*H01L 21/337* (2006.01)
*H01L 21/8238* (2006.01)
*H01L 27/148* (2006.01)
*H01L 29/94* (2006.01)
(Continued)

(52) U.S. Cl.
CPC .... *H01L 21/76877* (2013.01); *H01L 27/11519* (2013.01); *H01L 27/11548* (2013.01); *H01L 27/11565* (2013.01); *H01L 27/11575* (2013.01); *H01L 27/1157* (2013.01); *H01L 27/11529* (2013.01); *H01L 27/11556* (2013.01); *H01L 27/11582* (2013.01)

(58) Field of Classification Search
CPC ............ H01L 27/2454; H01L 27/0688; H01L 27/0705; H01L 27/11578
USPC .......... 438/142, 157, 192, 195, 212; 257/211, 257/250, 329, 331, 341, 401
See application file for complete search history.

(56) References Cited

U.S. PATENT DOCUMENTS 8,435,857 B2   5/2013 Kiyotoshi
8,436,415 B2 * 5/2013 Kidoh et al. .................. 257/324
(Continued)

FOREIGN PATENT DOCUMENTS

JP   2012-174887 A   9/2012
JP   2012-174961 A   9/2012
(Continued)

*Primary Examiner* — Hsien Ming Lee
(74) *Attorney, Agent, or Firm* — Oblon, McClelland, Maier & Neustadt, L.L.P.

(57) ABSTRACT

According to an embodiment, a method for fabricating a pattern includes forming a mask covering a first layer, and a second layer selectively provided on the first layer, and forming a groove dividing the first layer and the second layer using the mask. The mask includes a first portion formed on a region of the first layer on a first side of the second layer, a second portion formed on a region of the first layer on a second side of the second layer opposite to the first side, first extending parts extending over the second layer from the first portion toward the second portion, and second extending parts extending over the second layer from the second portion toward the first portion. Each of the second extending parts is located between the first extending parts adjacent to each other.

14 Claims, 19 Drawing Sheets

(51) Int. Cl.
*H01L 21/768* (2006.01)
*H01L 27/115* (2006.01)

(56) References Cited

U.S. PATENT DOCUMENTS

2012/0184078 A1 7/2012 Kiyotoshi
2012/0211820 A1 8/2012 Komori et al.
2014/0077285 A1* 3/2014 Noda et al. ............... 257/324

FOREIGN PATENT DOCUMENTS

JP 2012-204437 A 10/2012
JP 2012-204592 A 10/2012

* cited by examiner ial Number US 9,159,613 B2

NON-VOLATILE MEMORY DEVICE, METHOD FOR FABRICATING PATTERN ON WAFER AND METHOD FOR MANUFACTURING NON-VOLATILE MEMORY DEVICE USING SAME

CROSS-REFERENCE TO RELATED APPLICATIONS

This application is based upon and claims the benefit of priority from Japanese Patent Application No. 2013-175485, filed on Aug. 27, 2013; the entire contents of which are incorporated herein by reference.

FIELD

Embodiments are generally related to a non-volatile memory device, a method for fabricating a pattern on a wafer and a method for manufacturing a non-volatile memory device using the same.

BACKGROUND

The development of non-volatile memory devices with a 3-dimensional memory array is progressing. For example, there are memory devices having word lines stacked on an underlying layer, and semiconductor pillars that pierce therethrough. Memory cells and selection gates are disposed on the side face of the semiconductor pillars. Also, the gap between the semiconductor pillars is tending to become narrower due to size reduction in the memory array associated with the increasing of storage capacity. Therefore, manufacturing processes such as photolithography are becoming more difficult, and then, production yield may be reduced.

DETAILED DESCRIPTION

Figure 1:
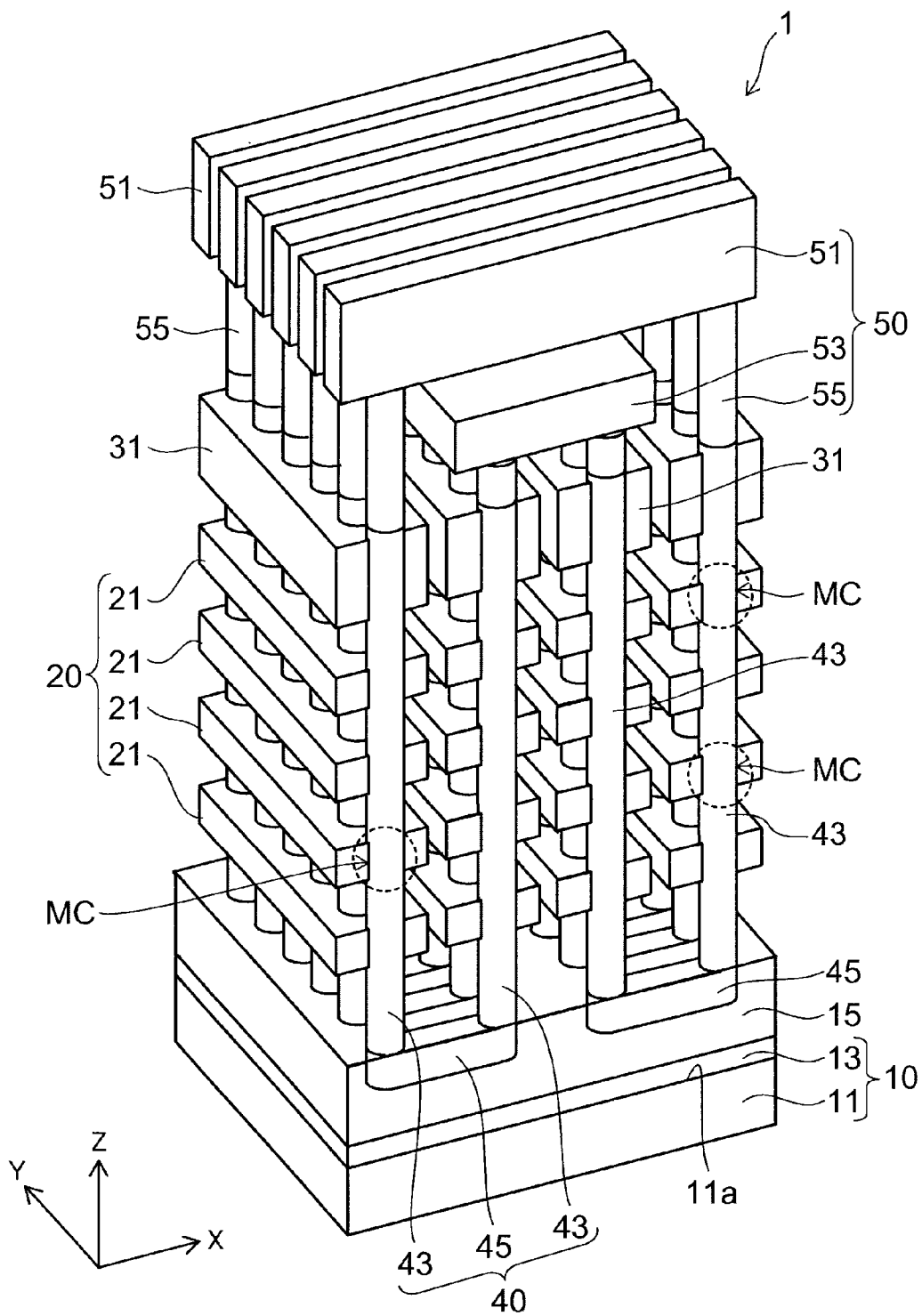
FIG. 1 is a perspective view schematically illustrating a non-volatile memory device according to a first embodiment.

According to an embodiment, a method for fabricating a pattern includes forming a mask covering a first layer, and a second layer selectively provided on the first layer, and forming a groove dividing the first layer and the second layer by selectively etching the first layer and the second layer using the mask. The mask includes a first portion formed on a region of the first layer on a first side of the second layer, a second portion formed on a region of the first layer on a second side of the second layer opposite to the first side, a plurality of first extending parts extending over the second layer from the first portion toward the second portion, and a plurality of second extending parts extending over the second layer from the second portion toward the first portion. Each of the second extending parts is located between the first extending parts adjacent to each other, and the first extending parts and the second extending parts are disposed alternately.

Embodiments will now be described with reference to the drawings. The same numerals are applied to constituents that have already appeared in the drawings, and repetitious detailed descriptions of such constituents are omitted. Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

First Embodiment

FIG. 1 is a perspective view schematically illustrating a non-volatile memory device according to a first embodiment.

Figure 2:
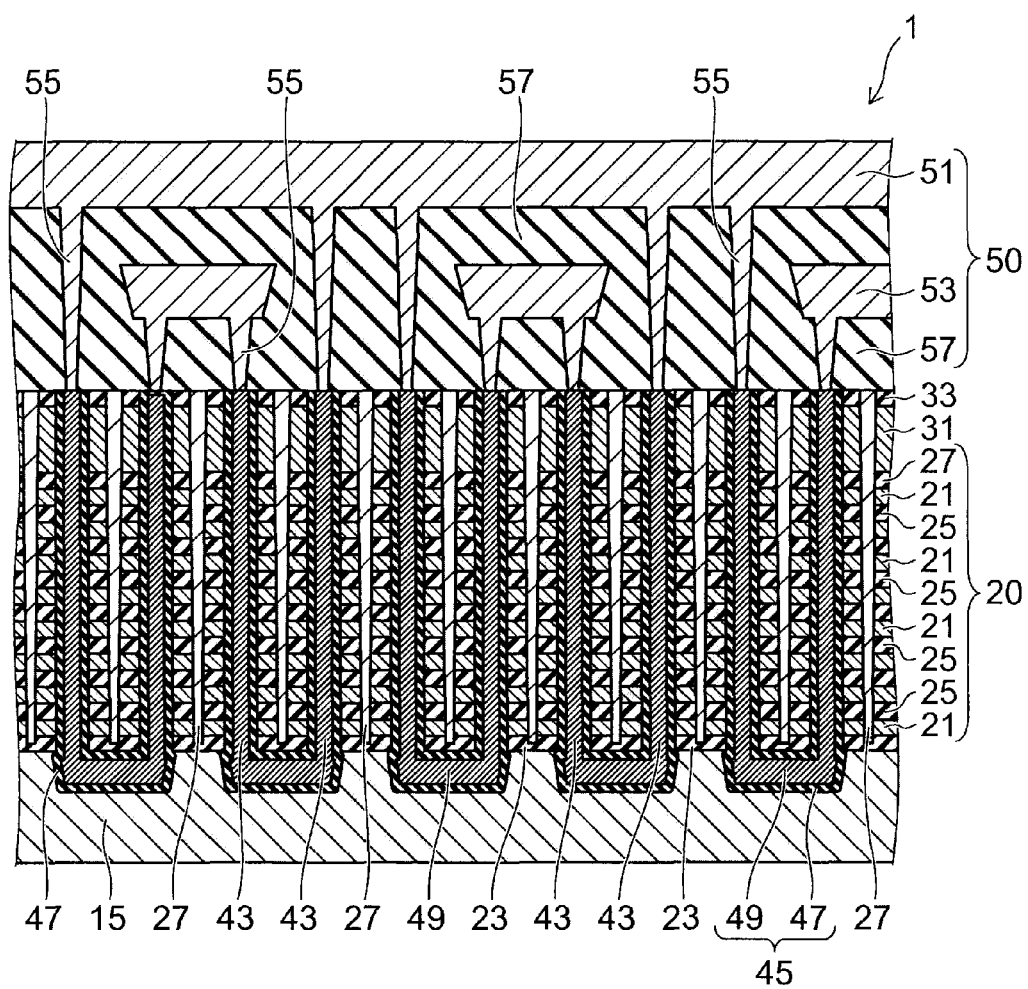
FIG. 2 is a schematic cross-sectional view illustrating the non-volatile memory device according to the first embodiment.

FIG. 2 is a schematic cross-sectional view illustrating the non-volatile memory device according to the first embodiment.

The non-volatile memory device according to the embodiment is a so-called NAND flash memory, and includes a memory cell array 1 disposed in 3-dimensions. FIG. 1 is a perspective view illustrating a portion of the memory cell array 1, in which insulating film has been omitted in order that the structure is easy to understand. In other words, each element of the memory cell array 1 is insulated from the others by insulating film not illustrated on the drawing.

As illustrated in FIG. 1, the non-volatile memory device includes the memory cell array 1 provided on a underlying layer 10.

The underlying layer 10 includes, for example, a substrate 11, and an interlayer insulating film 13 provided on the substrate 11. The substrate 11 is, for example, a silicon wafer, and circuits for controlling the memory cell array 1 are provided on the top surface 11a of the substrate 11. The interlayer insulating film 13 is provided on the substrate 11. Also, the memory cell array 1 is provided on the interlayer insulating film 13.

The memory cell array 1 includes a conductive film 15 provided on the interlayer insulating film 13, a stacked body 20 provided on the conductive film 15, a selection gate 31 provided on the stacked body 20, and an interconnection layer 50 provided on the selection gate 31. The stacked body 20 includes a plurality of word lines 21, and the interconnection layer 50 includes a bit line 51 and a source line 53.

In the following description, the direction perpendicular to the top surface 11a of the substrate 11 is taken to be the Z-direction, and one of two directions perpendicular to the Z-direction is taken to be the X-direction, and the other is taken to be the Y-direction. Also, the Z-direction is sometimes referred to as upward, and the opposite as downward.

As illustrated in FIG. 1, the memory cell array 1 includes the plurality of stacked bodies 20. The plurality of stacked bodies 20 is juxtaposed along the X-direction. Each of the plurality of word lines 21 included in the stacked body 20 is provided in stripe form extending in the Y-direction and stacked in the Z-direction.

The selection gate 31 is provided above each of the stacked bodies 20 juxtaposed in the X-direction, extending in the Y-direction. In addition, semiconductor pillars 43 are provided piercing through the stacked bodies 20 and the selection gate 31 in the Z-direction.

Two semiconductor pillars 43 that pierce through two stacked bodies 20 adjacent to each other in the X-direction are electrically connected by a connection part 45. Also, the top ends of the two semiconductor pillars 43 are electrically connected to the bit line 51 and the source line 53 via a plug 55. In other words, a memory cell string 40 provided between the bit line 51 and the source line 53 includes two semiconductor pillars 43 and the connection part 45 that connects them.

There is a memory film 47 on the outer surfaces of the semiconductor pillar 43 and the connection part 45 (see FIG. 2). The memory film 47 provided between the semiconductor pillar 43 and the word line 21 serves as a charge storage layer. In other words, a memory cell MC is formed between each word line 21 and the semiconductor pillar 43. Also, a selection transistor is formed between the selection gate 31 and the semiconductor pillar 43. The memory film 47 serves as a gate insulating film of the selection transistor. The memory film 47 in the connection part 45 provides electrical insulation between the connection part 45 and the conductive film 15.

As illustrated in FIG. 2, the semiconductor pillar 43 includes, for example, a semiconductor layer 49, and is provided in pillar form extending in the Z-direction. The outer surface of the semiconductor pillar 43 includes the memory film 47. The connection part 45 includes, for example, the semiconductor layer 49, and the memory film 47 provided on the outer surface of the semiconductor layer 49. The semiconductor layer 49 is, for example, a polycrystalline silicon (polysilicon) layer, that is continuously provided in the semiconductor pillar 43 and the connection part 45.

As described later, the semiconductor pillar 43 is provided within a hole that pierces through the stacked body 20 and the selection gate 31. For example, the semiconductor pillar 43 is formed by depositing the semiconductor layer 49 (for example, polysilicon film) on the memory film 47 formed on the inner face of the through hole. Then, the semiconductor pillar 43 may have a pillar like structure that fills the through hole, or may have a hollow structure in which a cavity remains on the inner side of the through hole.

An insulating film 23 is provided on the conductive film 15, and the stacked body 20 is provided on the insulating film 23. The stacked body 20 includes the plurality of word lines 21 and a plurality of insulating films 25, and each word line 21 and each insulating film 25 are stacked alternately. The word line 21 is, for example, a conductive polysilicon film. The insulating film 25 is a non-conductive film, for example, that includes at least one of a silicon oxide film and a silicon nitride film.

The plurality of stacked bodies 20 is juxtaposed on the conductive film 15. Also, an insulating film 27 is provided between each stacked body 20 and the conductive film 15. The insulating film 27 includes, for example, at least one of a silicon oxide film and a silicon nitride film. Also, the portion of the word line 21 that contacts the insulating film 27 is silicided.

The insulating film 27 also extends between each of the plurality of selection gates 31 provided on the stacked body 20. The portion of the selection gate 31 that contacts the insulating film 27 is silicided. Thus, the resistance of the word lines 21 and the selection gates 31 is reduced by siliciding their ends. In this way, it is possible to increase the speed of writing data to the memory cell MC and reading the data therefrom.

Next, a method of manufacturing the non-volatile memory device according to the first embodiment is described with reference to FIGS. 3 to 11.

Figure 3:
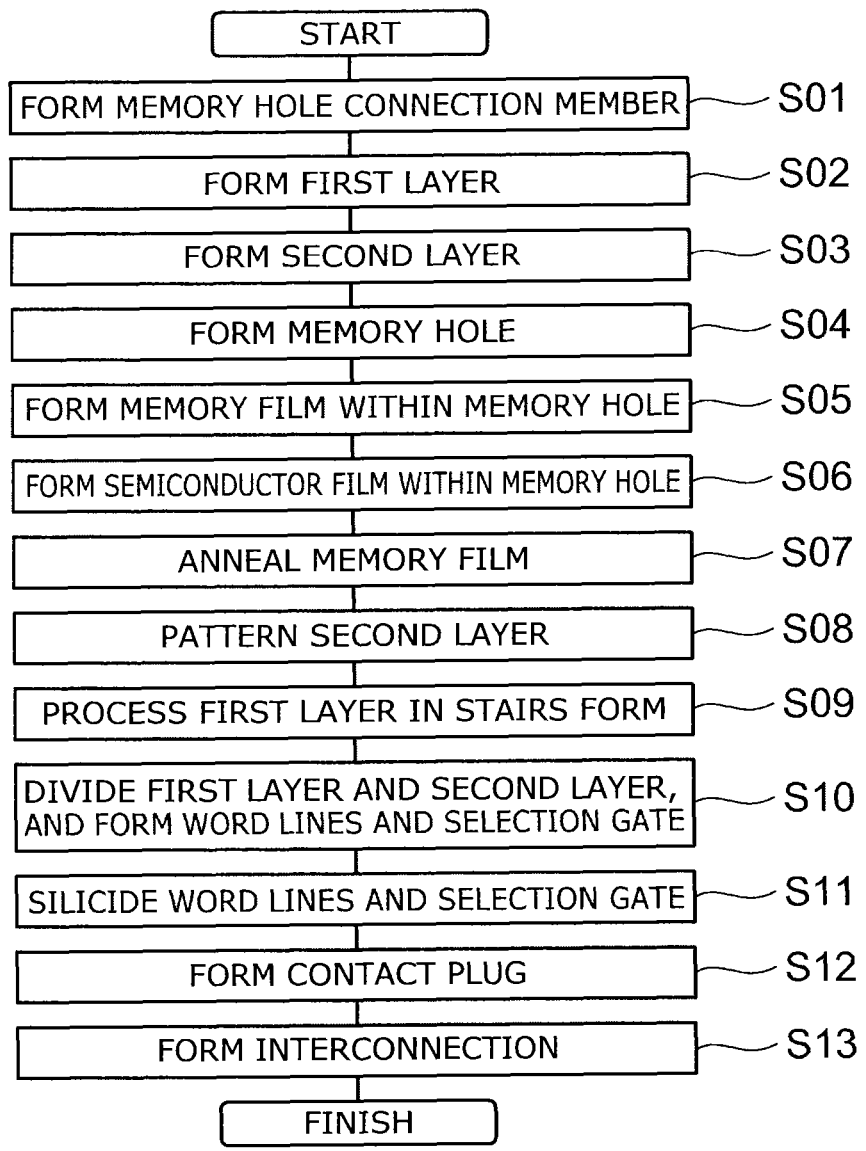
FIG. 3 is a flow diagram illustrating a manufacturing process of the non-volatile memory device according to the first embodiment.

FIG. 3 is a flow diagram illustrating the process of manufacturing the non-volatile memory device according to the first embodiment. FIGS. 4A to 11 are schematic views illustrating the process of manufacturing the non-volatile memory device according to the first embodiment.

Figure 4A:
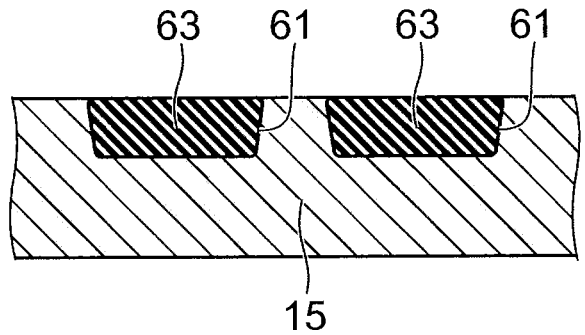
FIGS. 4A to 11 are schematic views illustrating the manufacturing process of the non-volatile memory device according to the first embodiment.

FIG. 4A is a schematic view illustrating a cross-section of the conductive film 15 provided on the underlying layer 10. As illustrated in this drawing, a groove 61 is formed on the top surface of the conductive film 15 so as to provide the connection part 45 therein, and a sacrificial film 63 is embedded in the groove 61 (S01).

The conductive film 15 is a polysilicon film formed using, for example, the chemical vapor deposition method (CVD). A material such as silicon nitride film that is capable of selectively etching with respect to the conductive film 15 can be used for the sacrificial film 63.

Figure 4B:
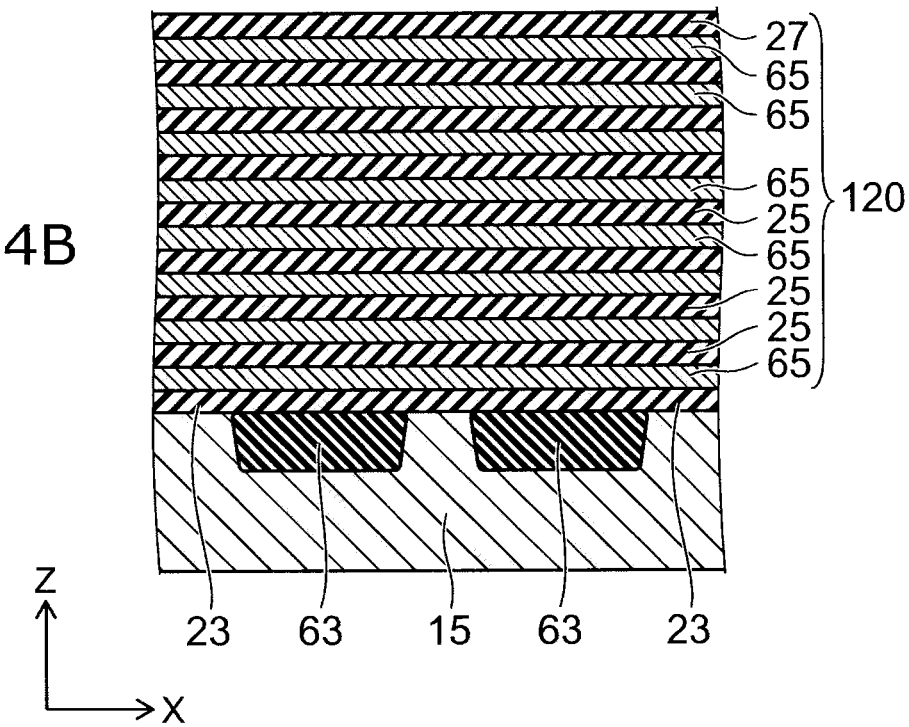

Next, FIG. 4B is a schematic cross-sectional view of a first layer 120 formed on the conductive film 15. The first layer 120 includes the first insulating films (insulating film 25), and a plurality of first conductive films (hereinafter, conductive film 65).

As illustrated in FIG. 4B, the first layer 120 is formed on the conductive film 15 with the insulating film 23 disposed between the first layer 120 and the conductive film 15 (S02). The insulating film 23 includes, for example, tantalum oxide (TaO) or the like, and electrically insulates the conductive film 15 from the conductive film 65. Preferably, the insulating film 23 has resistivity against an etching condition for the first layer 120. In other words, the insulating film 23 serves as an etching stop layer when etching the first layer 120.

The first layer 120 is formed by alternately stacking the conductive film 65 and the insulating film 25 on the insulating film 23. The conductive film 65 is, for example, a polysilicon film formed using the CVD method, and ultimately serves as the word line 21. The insulating film 25 is, for example, a silicon oxide film, that provides between two adjacent word lines 21 in the Z-direction so as to electrically insulate one from the other.

In addition, the first layer 120 includes the insulating film 27 formed on the conductive film 65. The insulating film 27 electrically insulates the selection gate 31 formed on the first layer 120 from the word line 21.

Figure 5A:
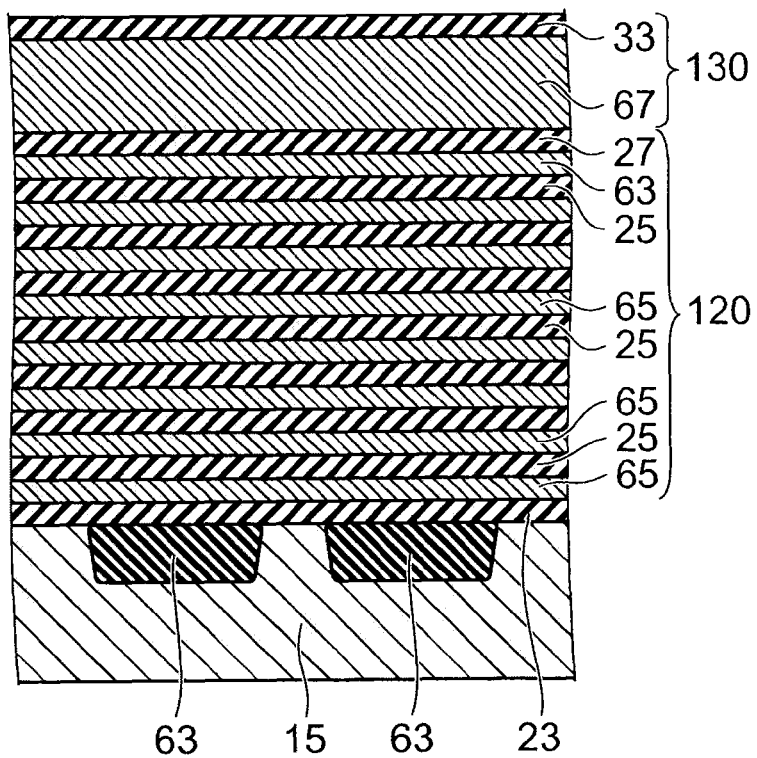

Next, FIG. 5A is a cross-sectional view illustrating a second layer 130 formed on the first layer 120 (S03). The second layer 130 includes a second conductive film (hereinafter, conductive film 67), and an insulating film 33 formed on the conductive film 67.

The conductive film 67 is, for example, a polysilicon film formed using the CVD method, and ultimately serves as the selection gate 31. The insulating film 33 protects the conductive film 67 in subsequent processes.

Figure 5B:
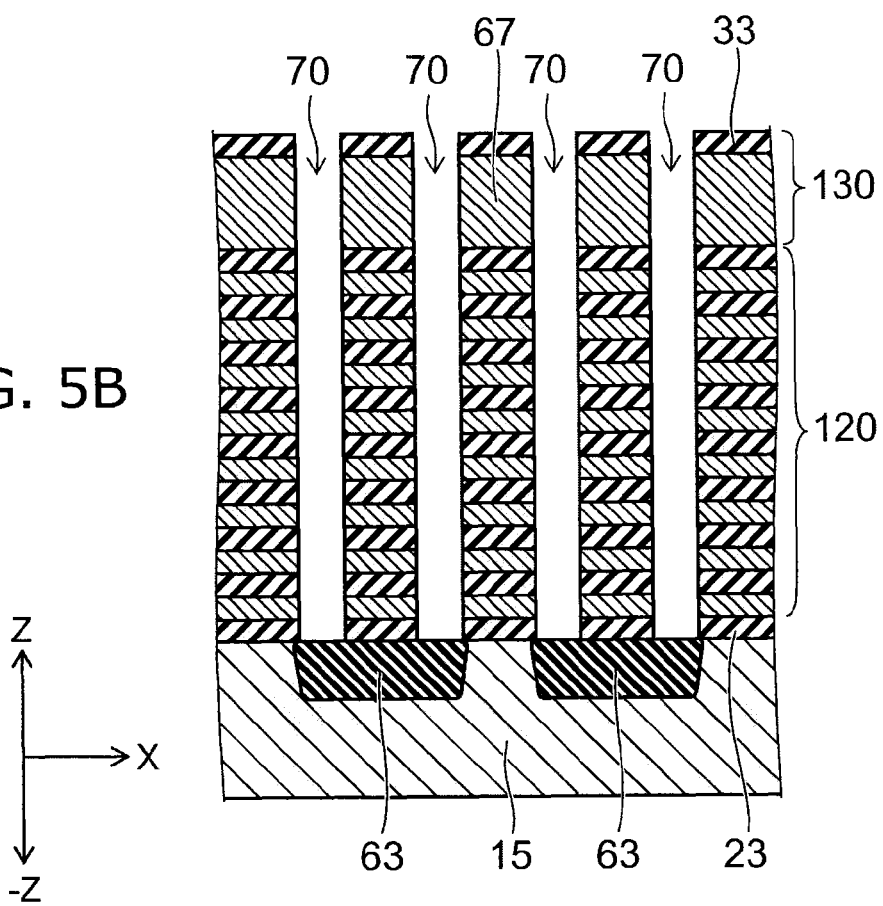

Next, FIG. 5B is a cross-sectional view illustrating a memory hole 70 that pierces through the second layer 130 and the first layer 120 from the top surface of the insulating film 33 in the Z-direction so as to be in communication with the sacrificial film 63. The memory hole 70 is formed by sequentially etching the second layer 130, the first layer 120, and the insulating film 23 in order using, for example, anisotropic reactive ion etching (RIE) (S04). The memory holes 70 are formed to be aligned in the X-direction, and, for example, a pair of memory holes 70 adjacent to each other is formed so as to be in communication with a sacrificial film 63 at both ends thereof.

Figure 6A:
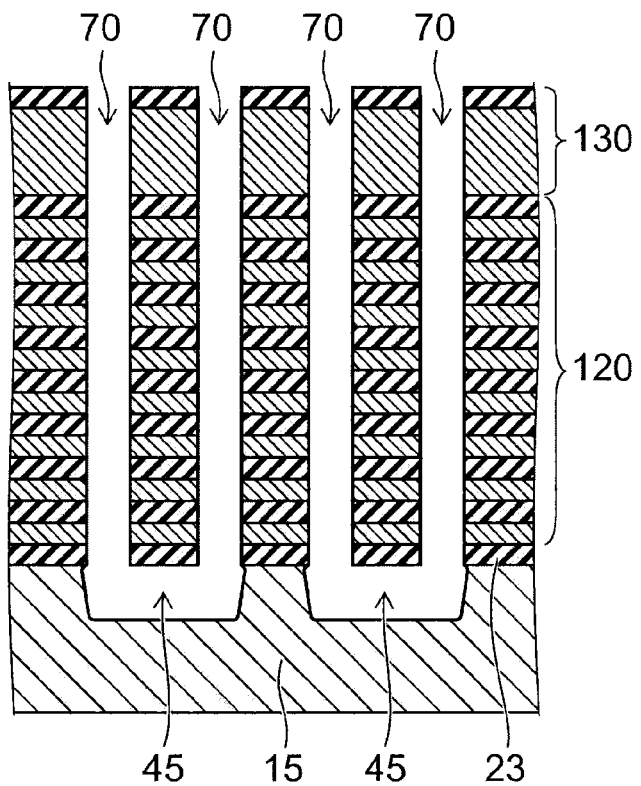

Next, FIG. 6A is a cross-sectional view illustrating the connection part 45 (i.e. connection hole) that connects the two adjacent memory holes 70. The connection part 45 is formed by selectively etching the sacrificial film 63 through the memory holes 70. For example, the sacrificial film 63 only is removed by using an etching solution that does not etch the conductive film 15, the first layer 120, and the second layer 130.

Figure 6B:
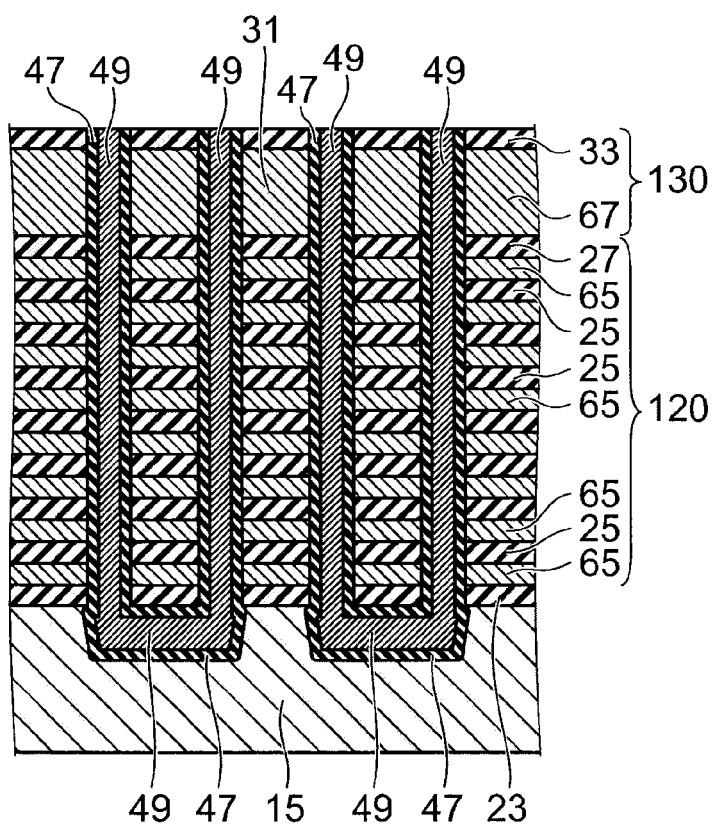

Next, FIG. 6B is a cross-sectional view illustrating the memory film 47 and the semiconductor layer 49 formed inside the memory hole 70. The memory film 47 is, for example, formed using the CVD method (S05), and has a multilayer structure with silicon oxide film, silicon nitride film, and silicon oxide film stacked in order.

The semiconductor layer 49 is stacked on the memory film 47 formed on the inner face of the memory hole 70 and the connection part 45 (S06). The semiconductor layer 49 is, for example, a polysilicon layer formed using the CVD method. The semiconductor layer 49 may be formed to as to fill an inside space of the memory hole 70, or it may have a hollow structure with a space in the center of the memory hole 70 and the connection part 45. Then, the semiconductor pillar 43 is configured from the memory film 47 and the semiconductor layer 49 formed inside the memory hole 70. The connection part 45 electrically connects two adjacent semiconductor pillars 43.

The memory film 47 is, for example, a charge storage film, that is capable of retaining charge injected from the semiconductor layer 49. Also, in order to improve the charge storage characteristic of the memory film 47, the memory film 47 is preferably annealed at a temperature of not less than 800° C., for example (S07).

Figure 7A:
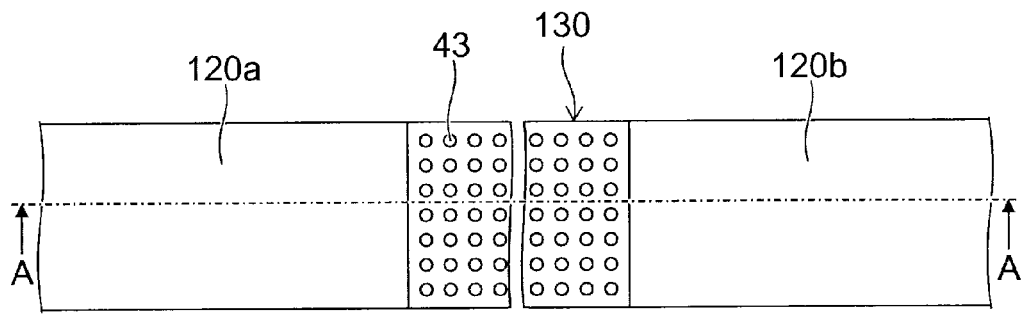
Figure 7B:
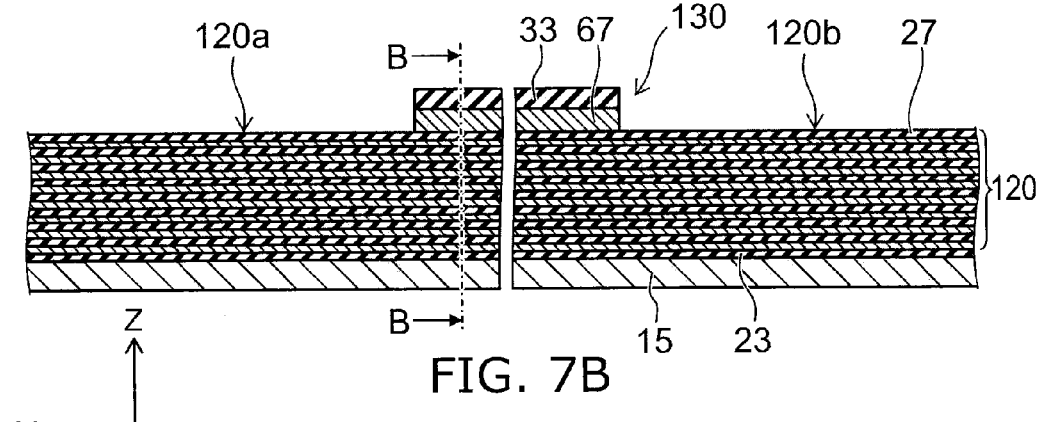
Figure 7C:
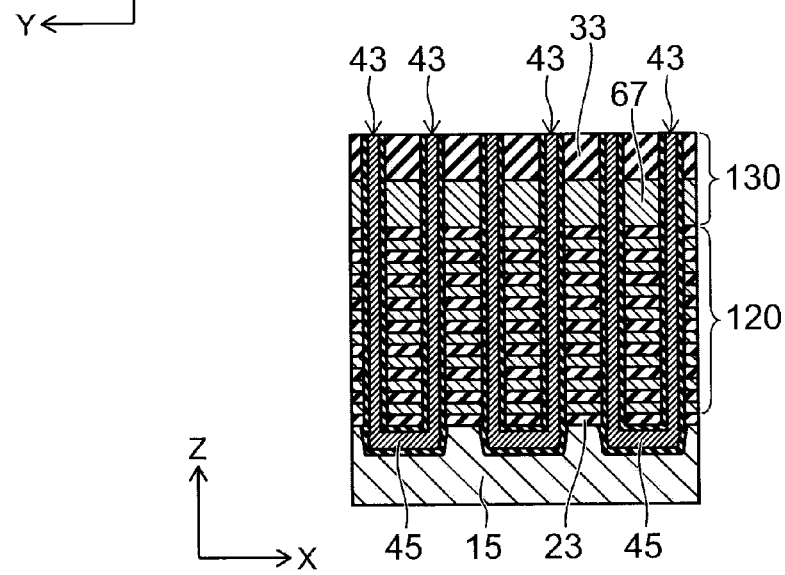

Next, FIGS. 7A to 7C are schematic views illustrating the second layer 130 selectively etched, and regions 120a and 120b that are parts of the first layer 120 exposed on both side of the second layer 130 (S08). FIG. 7A is a top surface view, illustrating one memory block. For example, the memory cell array 1 includes a plurality of memory blocks juxtaposed in the X-direction. FIG. 7B is a cross-sectional view along the line A-A depicted in FIG. 7A, and FIG. 7C is a cross-sectional view along the line B-B depicted in FIG. 7B.

As illustrated in FIG. 7A, the semiconductor pillars 43 is formed in the second layer 130 that remains on the first layer 120. As illustrated in this drawing, the semiconductor pillars 43 are arranged in a matrix form in the X-Y plane. Also, as illustrated in FIG. 7C, two adjacent semiconductor pillars 43 in the X-direction are electrically connected by the connection part 45.

Figure 8A:
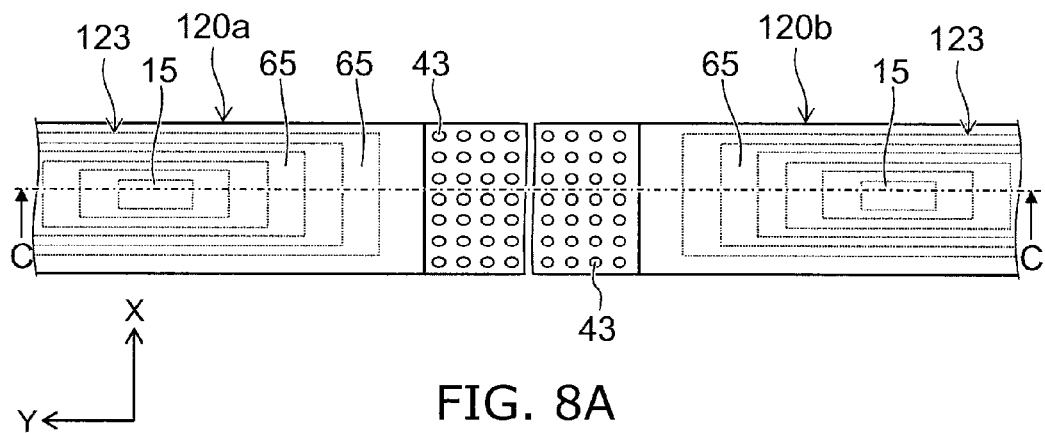
Figure 8B:
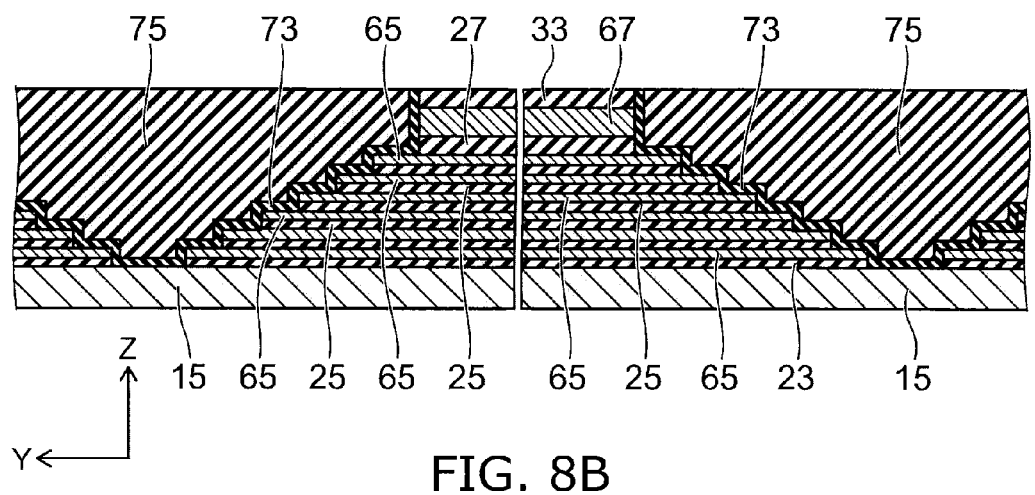

Next, FIGS. 8A and 8B are schematic views illustrating the regions 120a and 120b of the first layer 120 that include portions in a stairs form. FIG. 8A is a top surface view, and FIG. 8B is a cross-sectional view along the line C-C depicted in FIG. 8A.

As illustrated in FIG. 8A and FIG. 8B, an etching hole 123 is formed in the regions 120a and 120b of a portion of the first layer 120. The conductive film 15 is exposed on the bottom face of the etching hole 123. Also, the inside walls of the etching hole 123 are formed in a stairs shape, providing a contact region of a conductive film 65 exposed on each step (S09).

In addition, an insulating film 73 is formed covering the inner faces of the etching hole 123 and the side faces of the second layer 130. Next, an insulating film 75 is formed on the insulating film 73, filling the inside of the etching hole 123.

The insulating film 73 is, for example, a silicon oxide film formed using the CVD method, and the insulating film 75 is, for example, a silicon oxide film formed using the CVD method with tetra ethyl ortho silicate (TEOS) as the raw material.

The insulating film 73 and the insulating film 75 (third insulating film) cover the contact region of the plurality of conductive films 65 exposed on the inner wall of the etching hole 123, and the contact region of the conductive film 15 exposed in the bottom face of the etching hole 123.

In the specification, "cover" includes not only cases where the "covered object" directly contacts the "covering object", but also includes cases in which the covered object is covered with other elements disposed between the covered object and the covering object.

Figure 9A:
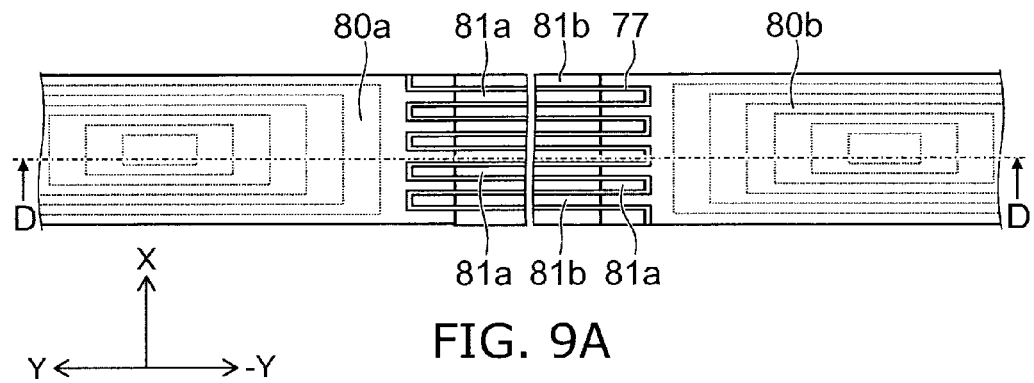
Figure 9B:
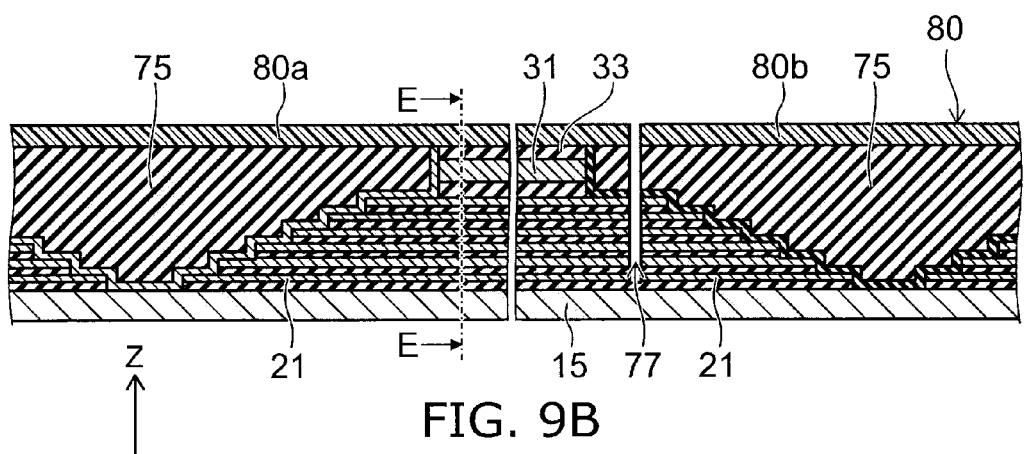
Figure 9C:
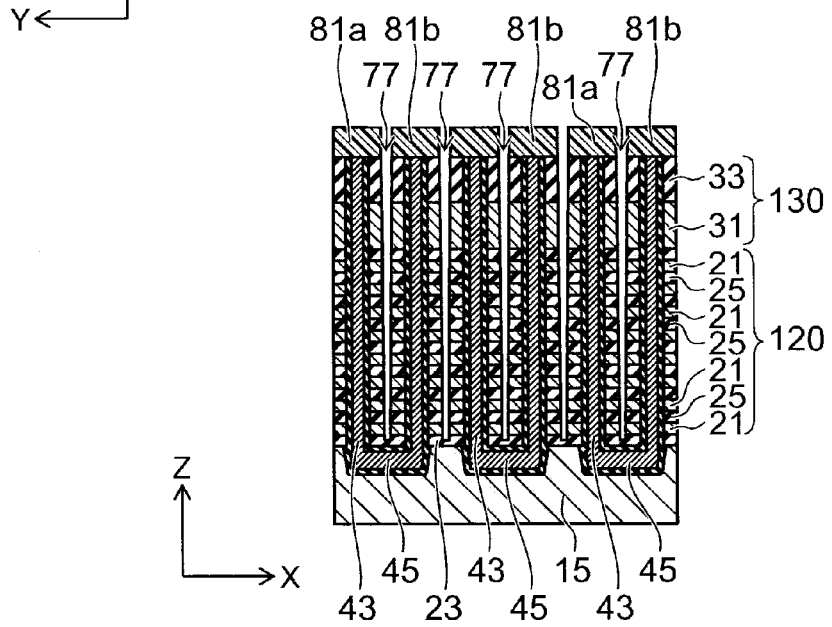

Next, FIGS. 9A to 9C are schematic views illustrating groove 77 that divides the first layer 120 and the second layer 130. FIG. 9A is a top surface view. FIG. 9B is a cross-sectional view along the line D-D depicted in FIG. 9A, and FIG. 9C is a cross-sectional view along the line E-E depicted in FIG. 9B.

For example, a mask 80 is formed on the insulating film 75 that covers each of the contact regions, and on the second layer 130.

As illustrated in FIGS. 9A and 9B, the mask 80 includes a first portion 80a and a second portion 80b. The first portion 80a is formed on the region 120a of the first layer 120 located on a first side of the second layer 130, and includes a plurality of first extending parts (hereinafter, extending part 81a) that extends in the −Y-direction from the first portion 80a toward the second portion 80b, passing over the second layer 130. On the other hand, the second portion 80b is formed on the region 120b of the first layer 120 located on a second side of the second layer 130, and includes a plurality of second extending parts (hereinafter, extending part 81b) that extends in the Y-direction from the second portion 80b toward the first portion 80a, passing over the second layer 130.

As illustrated in FIG. 9A, each of the extending parts 81b is located between two adjacent extending parts 81a among the extending parts 81a. In other words, each extending part 81a and each extending part 81b are disposed alternately in the X-direction. The extending parts 81a cover a first portion of the semiconductor pillars 43 (or, memory holes 70), and the second extending parts 81b cover a second portion of the semiconductor pillars 43.

Next, using the mask 80, the first layer 120 and the second layer 130 are selectively etched, to form the groove 77 that divides the first layer 120 and the second layer 130 (S10). The groove 77 is formed with depth from the top surface of the second layer 130 to the insulating film 23, using, for example, anisotropic RIE method. The etching in the depth direction (−Z-direction) is stopped by the insulating film 23. In other words, the insulating film 23 is not etched under the RIE conditions for etching the first layer 120 and the second layer 130, or, the etching speed is slower than the etching speed for the first layer 120 and the second layer 130. In this way, division of the conductive film 15 and the connection part 45 directly below the insulating film 23 is prevented.

The groove 77 divides the first layer 120 into two parts, and divides the second layer 130 into a plurality of stripe-shaped parts. In this way, the conductive films 65 included in the first layer 120 is divided into the word lines 21, and the conductive film 67 included in the second layer 130 is divided into the plurality of selection gates 31. In other words, each conductive films 65 is divided into two word lines 21 having a comb shape, and the conductive film 67 is divided into the stripe shaped selection gates 31.

Figure 10A:
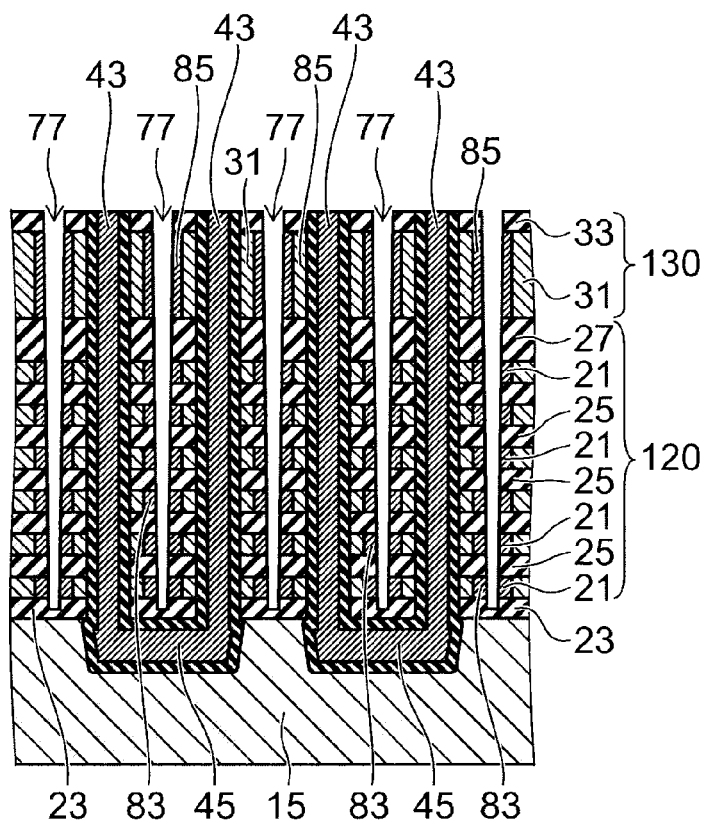

Next, FIG. 10A is a cross-sectional view illustrating the word lines 21 and the selection gate 31 that have been silicided in the groove 77. For example, a metal film that includes nickel (Ni) or cobalt (Co) is formed on the inner face of the groove 77, and by annealing, the end portions 83 of the word lines 21 (first conductive film) and the end portions 85 of the selection gate 31 (second conductive film) that are exposed in the inner wall of the groove 77 are silicided (S11). Then, parts of the metal film are removed, which are formed on the insulating films 23, 25, 27, and 33 exposed in the inner face of the groove 77. In this way, it becomes possible to reduce the electrical resistance of the word lines 21 and the selection gate 31.

Figure 10B:
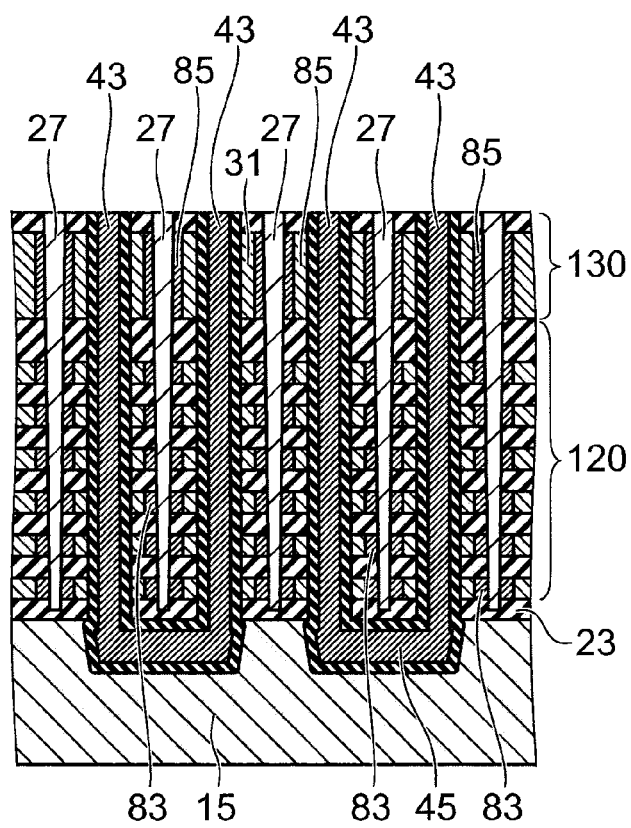

Next, FIG. 10B is a cross-sectional view illustrating the insulating film 27 (second insulating film) embedded within the groove 77. The insulating film 27 is, for example, a silicon oxide film formed by the CVD method.

Figure 11:
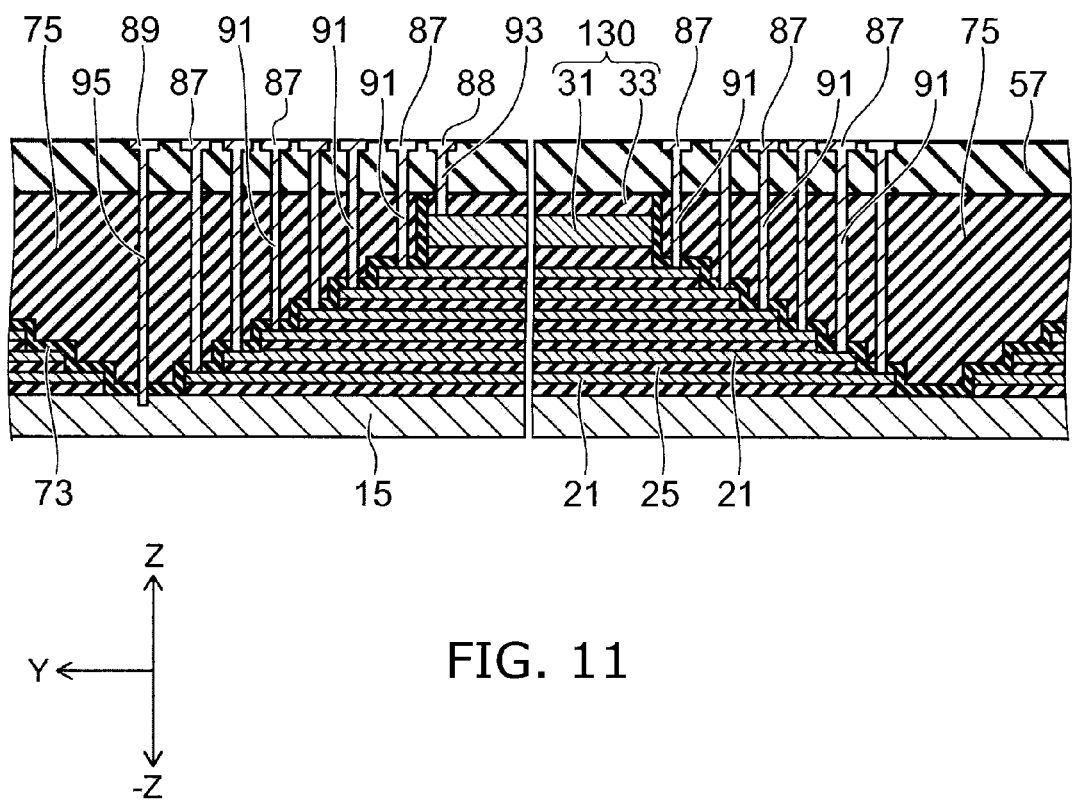

Next, FIG. 11 is a cross-sectional view illustrating interconnections 87, 88, and 89, and plugs 91, 93, and 95 formed in the interlayer insulating film 57 and the insulating film 75. The plug 91 electrically connects the interconnection 87 to the word line 21. The plug 93 electrically connects the interconnection 88 to the selection gate 31. Also, the plug 95 electrically connects the interconnection 89 to the conductive film 15. The conductive film 15, for example, serves as a back gate that controls the electrical resistance of the connection part 45.

As illustrated in FIG. 11, the interlayer insulating film 57 is formed on the insulating film 75 and on the second layer 130. The interlayer insulating film 57 is, for example, a silicon oxide film formed using the CVD method with TEOS as the raw material. Next, the plug 91, 93 and 95 are formed (S12). The plug 91 pierces through the interlayer insulating film 57, the insulating films 75 and 73, and is connected to the end of the word line 21. The plug 93 pierces through the interlayer insulating film 57 and the insulating film 33, and is connected to the selection gate 31. The plug 95 pierces through the interlayer insulating film 57, the insulating film 75 and 73, and is connected to the conductive film 15. In addition, the interconnections 87, 88, and 89 are formed on the top surface of the interlayer insulating film 57 (S13). Also, the source line 53 and the plug 55 (see FIG. 2) may be formed at the same time.

Next, another interlayer insulating film 57 is formed on the interconnections 87, 88, and 89, and the bit line 51 is formed thereupon, to complete the memory cell array 1. The bit line 51 is, for example, electrically connected to the semiconductor pillar 43 by the plug 55 that passes through the interlayer insulating film 57 (see FIG. 2).

Comparative Example

Figure 15:
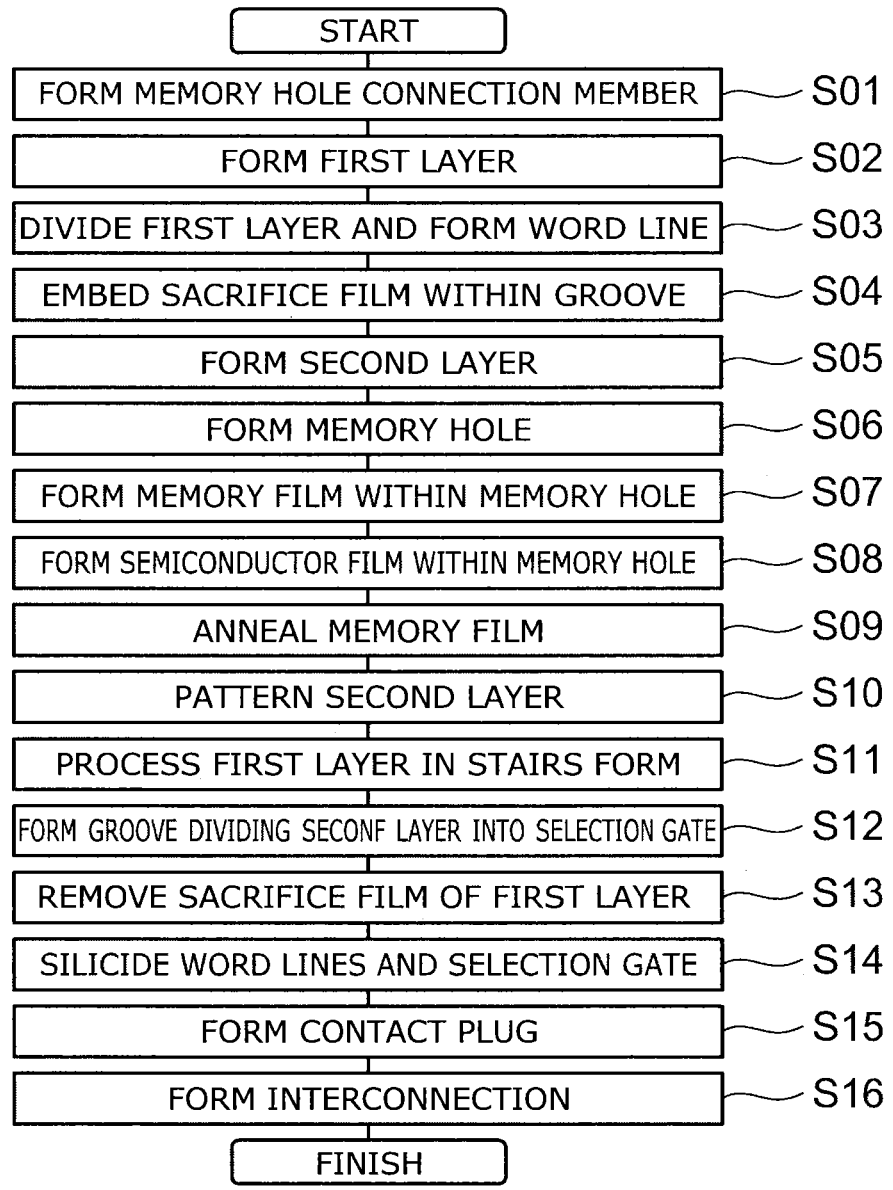
FIG. 15 is a flow diagram illustrating a manufacturing process of a non-volatile memory device according to a comparative example.

Next, a method for manufacturing a non-volatile memory device according to a comparative example is described with reference to FIGS. 15 to 19. FIG. 15 is a flow diagram illustrating the manufacturing process of the non-volatile memory device according to the comparative example. FIGS. 16A to 19 are schematic views illustrating the manufacturing process of the non-volatile memory device according to the comparative example. In the following description, the parts that differ from the process of manufacturing in the first embodiment illustrated in FIG. 3 are described, and the description of the parts that are the same is omitted as appropriate.

As illustrated in FIG. 15, in the method for manufacturing the non-volatile memory device according to the comparative example, in step 03, groove are formed so as to divide the first layer 120 into tow parts, and in step 04, a sacrificial film is formed on the inside of the groove.

Figure 16A:
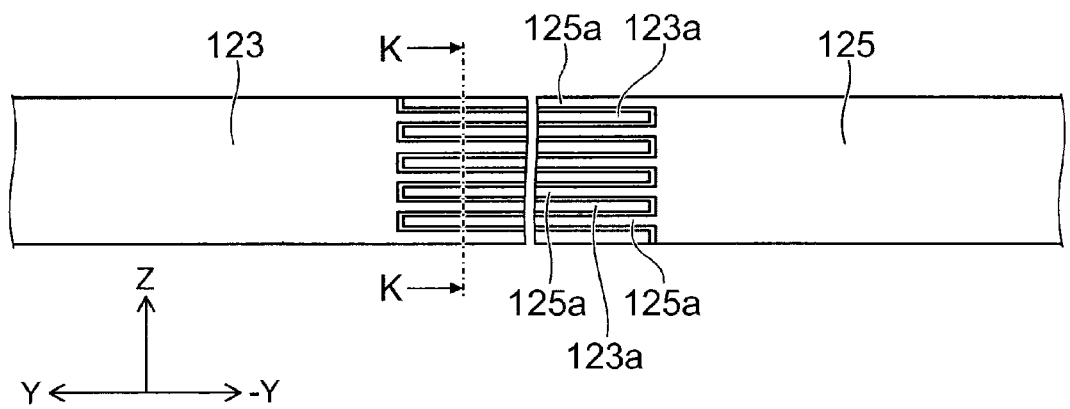
FIGS. 16A to 19 are schematic views illustrating the manufacturing process of the non-volatile memory device according to the comparative example.
Figure 16B:
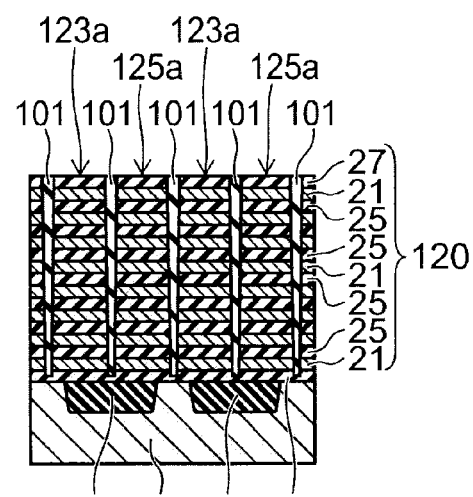

FIGS. 16A and 16B are schematic views illustrating a sacrificial film 101 embedded in the inside of the groove that separate the first layer 120. FIG. 16A is a top surface view, and FIG. 16B is a cross-sectional view along the line K-K depicted in FIG. 16A.

As illustrated in FIG. 16A, the first layer 120 is divided into two stacked bodies 123, 125 having a comb shape. The stacked body 123 includes a plurality of extending parts 123a that extends in the −Y-direction, and the stacked body 125 includes a plurality of extending parts 125a that extends in the Y-direction.

Each of the extending parts 123a is located between two adjacent extending parts 125a among the plurality of extending parts 125a. As a result, each extending part 123a and each extending part 125a are disposed alternately in the X-direction.

As illustrated in FIG. 16B, a sacrificial film 101 is formed between the extending parts 123a and the extending parts 125a. The sacrificial film 101 is, for example, a silicon nitride film formed using the CVD method. Thus, the stacked bodies 123 and 125 include the word lines 21 each stacked in the Z-direction.

Figure 17A:
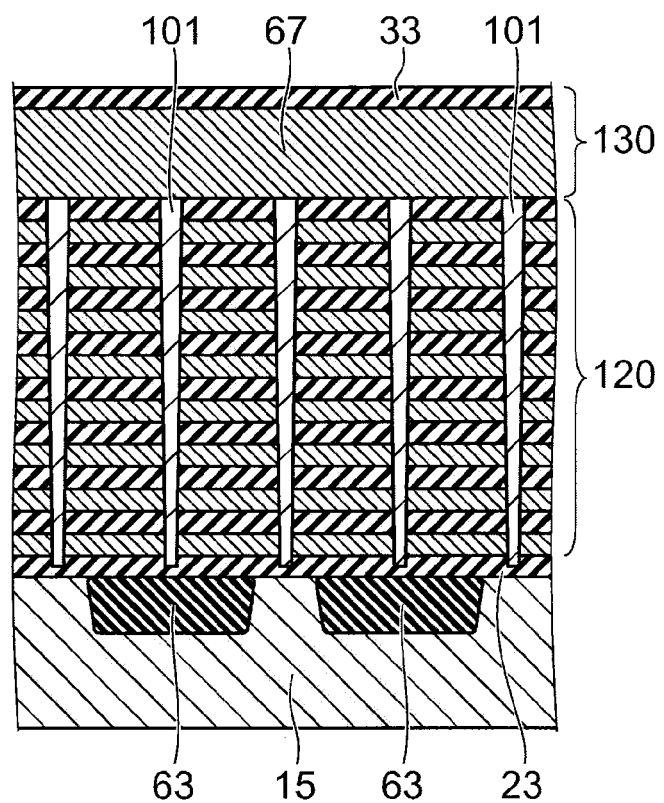

Next, FIG. 17A is a cross-sectional view illustrating the second layer 130 formed on the first layer 120. The second layer 130 is formed on the divided stacked body 123 and the stacked body 125, and the sacrificial film 101, using, for example, the CVD method (S05). The second layer 130 includes the conductive film 67, and the insulating film 33 formed on the conductive film 67.

Figure 17B:
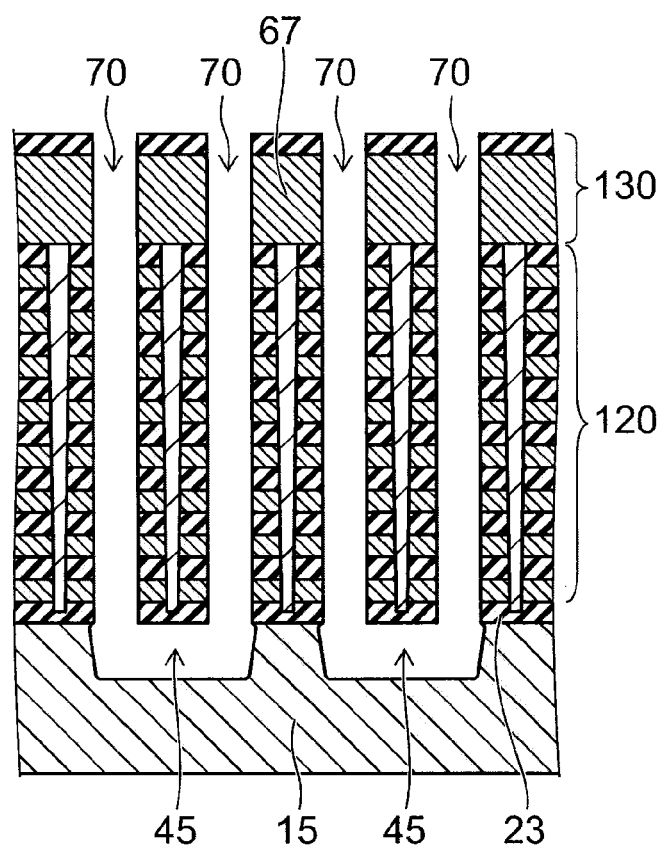

Next, FIG. 17B is a cross-sectional view illustrating the memory hole 70 that passes through the second layer 130 and the first layer 120. Two adjacent memory holes 70 are formed so that they are connected to each other via the connection part 45 (S06).

Figure 18A:
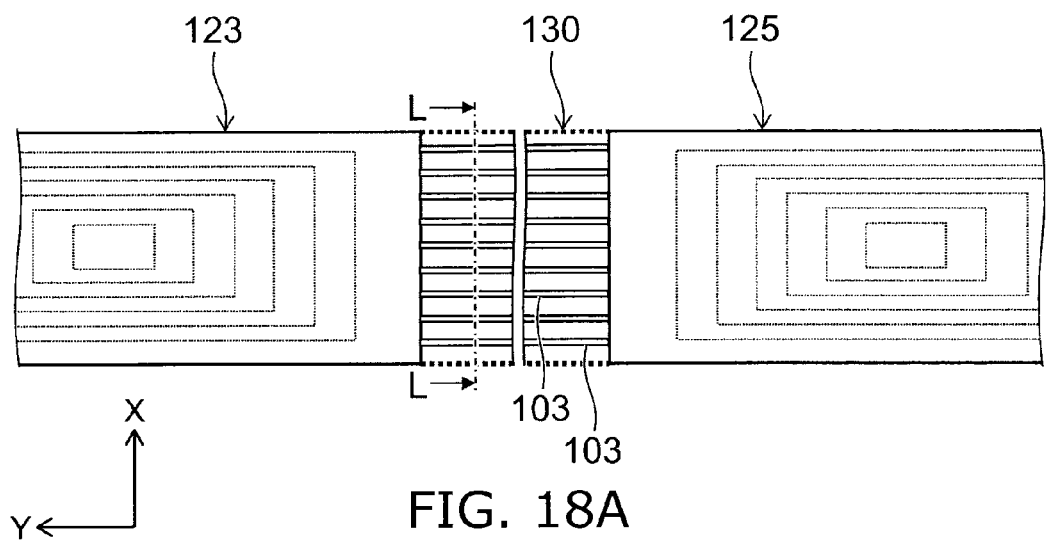
Figure 18B:
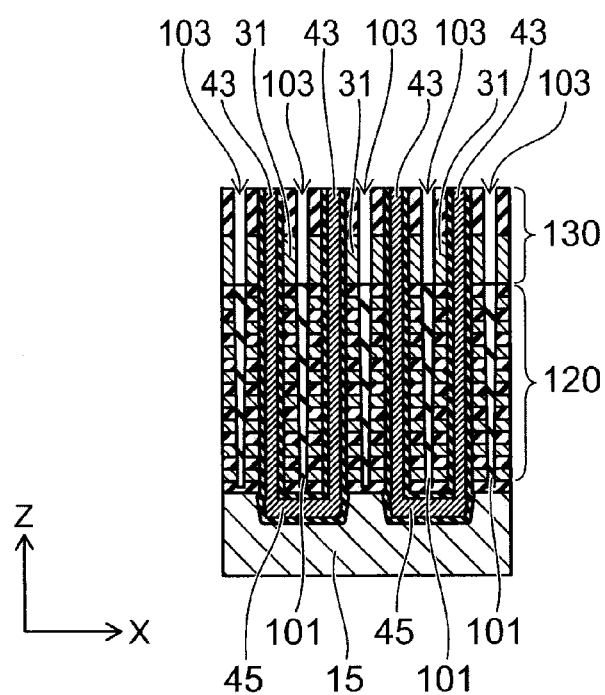

Next, FIGS. 18A and 18B is a schematic view illustrating grooves 103 that divide the second layer 130. FIG. 18A is a top surface view, and FIG. 18B is a cross-sectional view along the line L-L depicted in FIG. 18A.

As illustrated in FIG. 18A, the second layer 130 is selectively etched (S10). Then, the grooves 103 are formed in the portion remaining on the first layer 120, dividing it into a plurality of stripe shaped portions (S12).

As illustrated in FIG. 18B, the grooves 103 are formed so as to be in communication with the sacrificial film 101 formed on the first layer 120. As a result, the conductive film 67 is divided into the selection gates 31.

Figure 19:
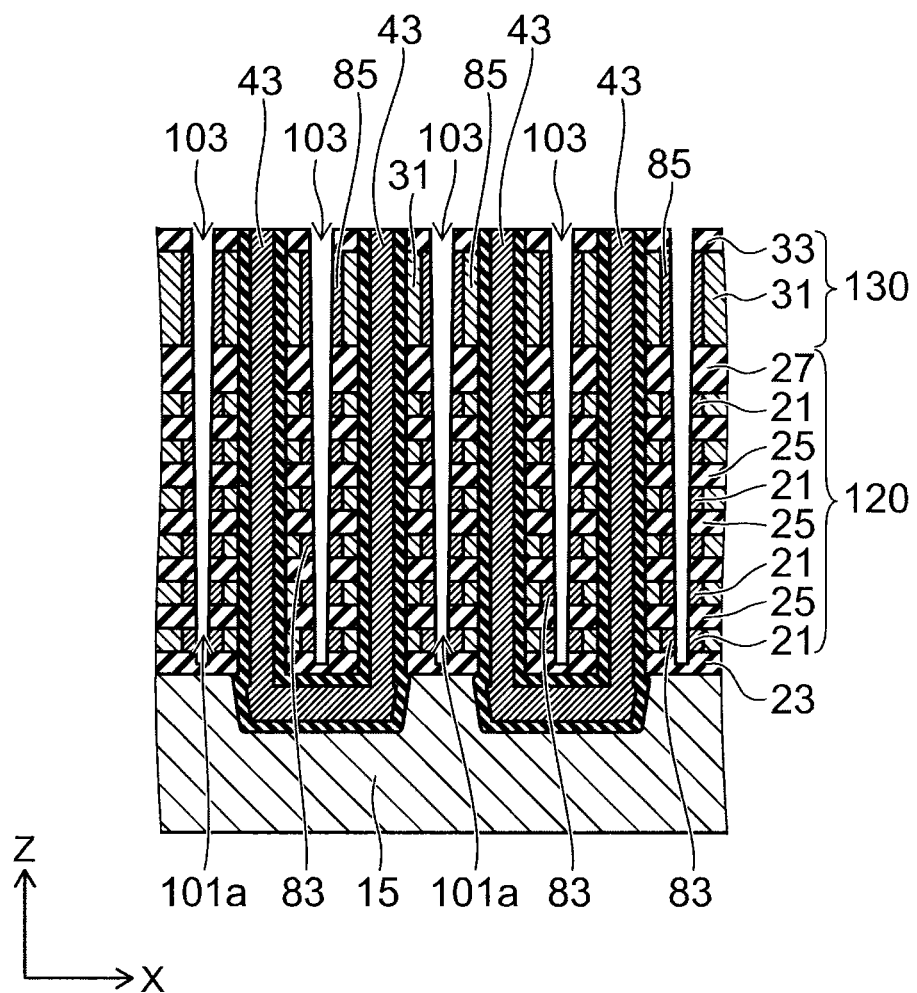

FIG. 19 is a cross-sectional view illustrating the silicided word lines 21 and the selection gate 31. In this example, the sacrificial film 101 is etched through the grooves 103 that divide the second layer 130, regenerating grooves 101a that divide the first layer 120. Then, the end portions 83 of the word lines 21 that are exposed in the inner walls of the grooves 101a and the end portions 85 of the selection gate 31 that are exposed in the inner wall of the grooves 103 are silicided (S14).

Then, the insulating film 27 is formed inside the grooves 101a and 103, and then, after steps S15 and S16, the memory cell array 1 is completed.

In the manufacturing method according to the comparative examples as described above, the grooves 101a that divide the first layer 120 and the grooves 103 that divide the second layer are formed in different steps. Therefore, as illustrated in FIG. 18B, it is necessary to align the grooves 103 with the grooves 101a. Also, when a deviation in the alignment becomes larger in the photolithography, the opening width at the boundary between the grooves 103 and the grooves 101a becomes narrower. In order to avoid such disadvantage, the photolithography process may accommodate more difficulty.

On the other hand, the spacing between the adjacent grooves 101a in the X-direction is equal to the spacing between the memory cells MC. Therefore, the width in the X-direction of the grooves 101a is, for example, set to a dimension close to the limit of resolution of the photolithography. As a result, the opening at the boundary between the grooves 103 and the grooves 101a becomes narrower due to an increased deviation in the mask alignment, and this could cause the metal film to be narrower inside the grooves 101a located below grooves 103. As a result, the siliciding may become insufficient, increasing electrical resistance of the word lines 21, and then in some cases, writing data to the memory cell MC or reading the data therefrom becomes defective.

In the manufacturing method according to the first embodiment, the grooves that divide the first layer 120 and the second layer 130 are formed together in a single step. In other words, the grooves that divide the first layer 120 and the second layer 130 are formed continuously, so the blockage of the opening may occur with less possibility in the process of siliciding. Also, it is possible to reduce the steps of photolithography and forming grooves. Thereby, the manufacturing processes are simplified, and the manufacturing efficiency may be improved.

Variation

FIGS. 12A to 13B are schematic views illustrating the process of manufacturing a non-volatile memory device according to a variation of the first embodiment.

Figure 12A:
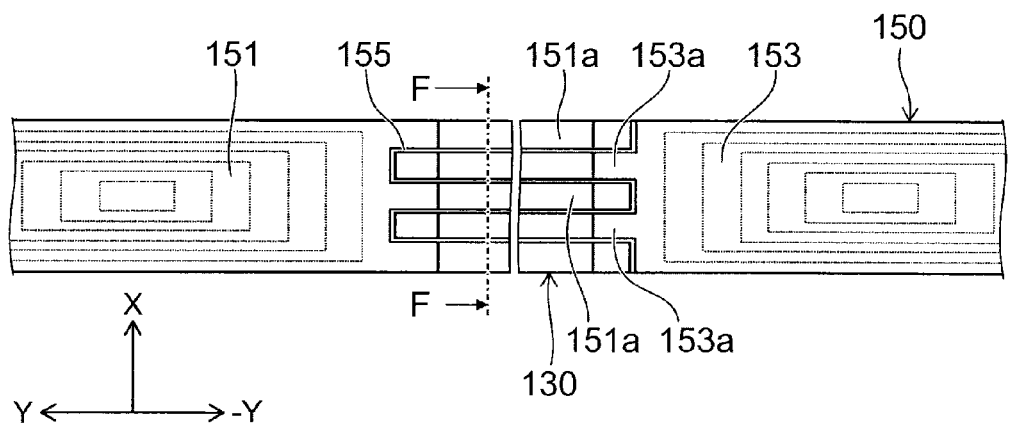
FIGS. 12A to 13B are schematic views illustrating a manufacturing process of a non-volatile memory device according to a variation of the first embodiment.
Figure 12B:
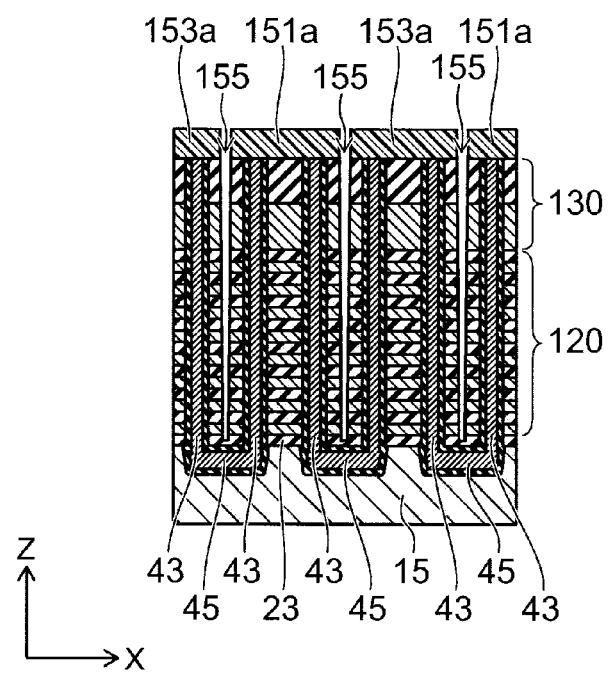

FIGS. 12A and 12B are schematic views illustrating a mask 150 formed on the second layer 130 and on the insulating film 75. FIG. 12A is a top surface view, and FIG. 12B is a cross-sectional view along the line F-F depicted in FIG. 12A.

The second layer 130 is selectively etched away, and a portion remains on the first layer 120. The insulating film 75 is formed on both sides of the second layer 130 covering the first layer 120 that is etched in stairs form (see FIG. 9B).

The mask 150 includes a first portion 151, and a second portion 153, and is used for dividing the first layer 120 and the second layer 130. The first portion 151 includes a plurality of extending parts 151a that extends in the −Y-direction toward the second portion 153, passing over the second layer 130. On the other hand, the second portion 153 includes a plurality of extending parts 153a that extends in the Y-direction toward the first portion 151, passing over the second layer 130.

As illustrated in FIG. 12A, each of the extending parts 153a is located between two adjacent extending parts 151a. Also, each extending part 151a and each extending part 153a are disposed alternately in the X-direction.

As illustrated in FIG. 12B, the extending parts 151a and the extending parts 153a cover the semiconductor pillars 43 (in other words, memory holes 70). Groove 155 that divide the first layer 120 and the second layer 130 are formed between two semiconductor pillars 43 that are electrically connected by the connection part 45.

As illustrated in FIG. 12B, the grooves 155 are formed with depth from the top surface of the second layer 130 to the insulating film 23. In other words, the etching to form the grooves 155 is stopped by the insulating film 23 which serves as an etching stop layer, so that the connection part 45 is not divided.

Figure 13A:
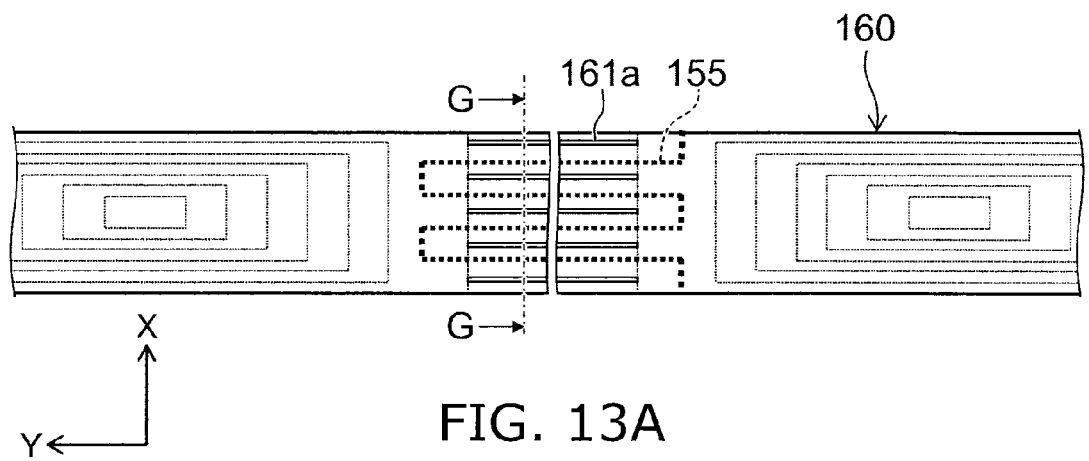
Figure 13B:
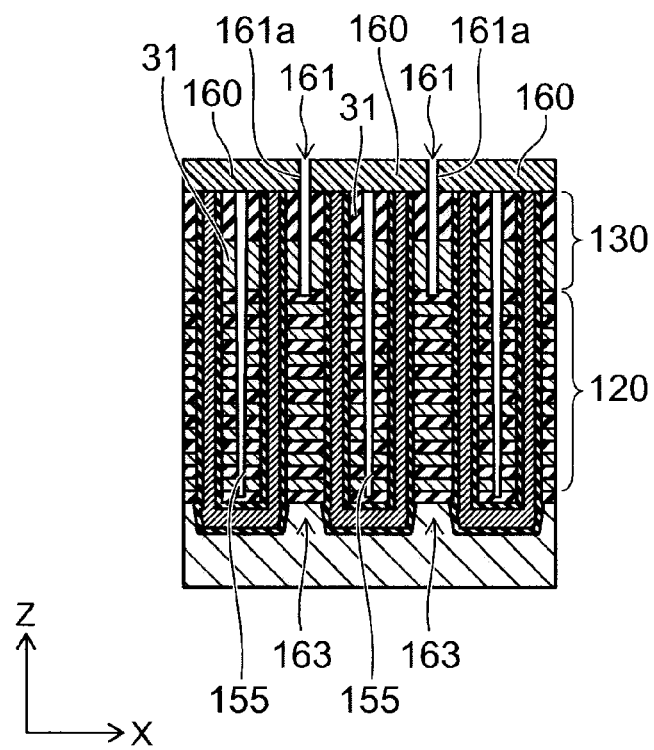

Next, FIGS. 13A and 13B are schematic views illustrating a mask 160 formed on the second layer 130 and the insulating film 75. FIG. 13A is a top surface view, and FIG. 13B is a cross-sectional view along the line G-G depicted in FIG. 13A.

As illustrated in FIG. 13A, the mask 160 includes a plurality of groove-shaped openings 161a. The openings 161a are juxtaposed in the X-direction, and extend in the Y-direction. Then, as illustrated in FIG. 13B, the spacing between two adjacent openings 161a in the X-direction is double the spacing between two adjacent semiconductor pillars 43.

In this example, grooves 161 that divide the second layer 130 are formed using the mask 160. As illustrated in FIG. 13B, the grooves 161 are formed in the space 163 between two semiconductor pillars 43 that are not connected by the connection part 45 among the semiconductor pillars 43 arranged in the X-direction. As a result, the conductive film 67 included in the second layer 130 is divided into the selection gates 31 by the grooves 155 and the grooves 161.

On the other hand, the first layer 120 is divided into a plurality of stacked bodies that includes two semiconductor pillars 43 that are not connected by the connection part 45, among the semiconductor pillars 43 aligned in the X-direction. In other words, the width in the X-direction of the stacked bodies formed by dividing the first layer 120 is double the width of the stacked bodies 20 in the first embodiment. In this way, it is possible to prevent the stacked bodies that include the stacked word lines from a collapse during the siliciding process in which the end portions of the word lines 21 and the end portion of the selection gate 31 are siliciding through the grooves 155 and 161. Also, the grooves 155 are formed by continuously etching the second layer 130 and the first layer 120, so there is less possibilty of blocking the grooves in the siliciding process.

Second Embodiment

Figure 14A:
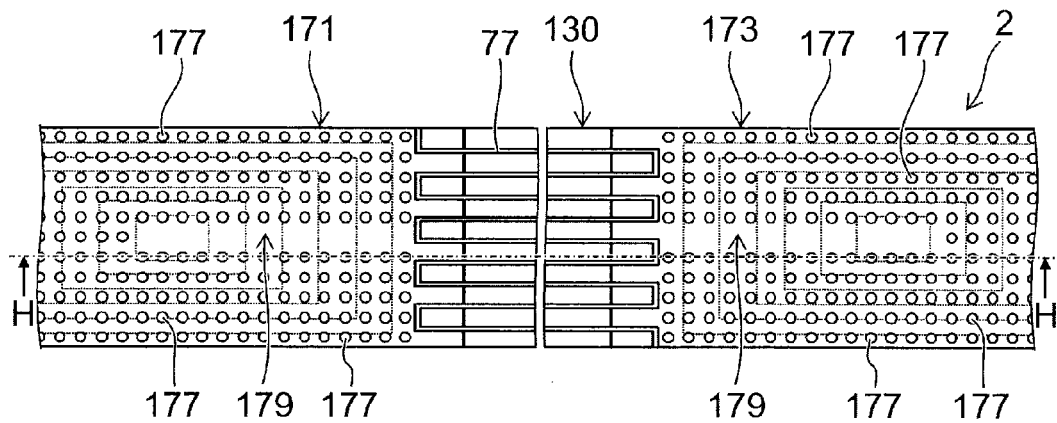
FIGS. 14A to 14C are schematic views illustrating a manufacturing process of a non-volatile memory device according to a second embodiment.
Figure 14B:
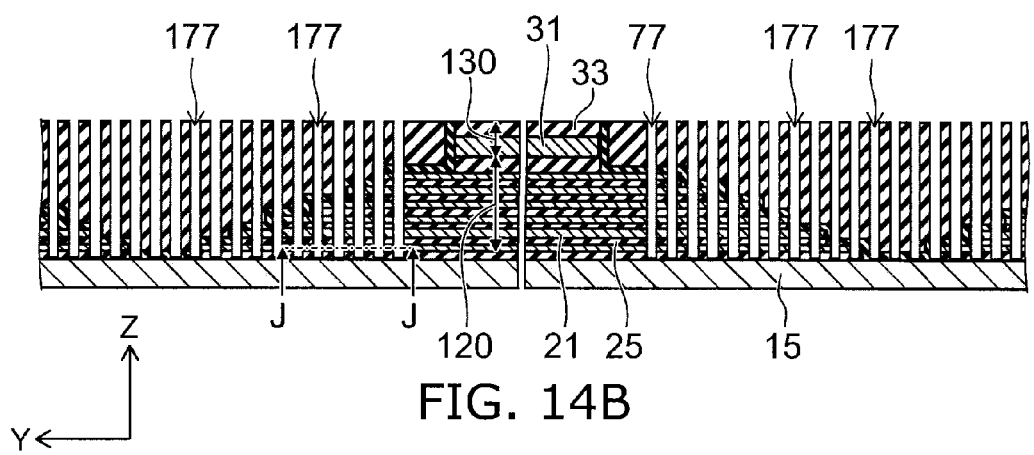
Figure 14C:
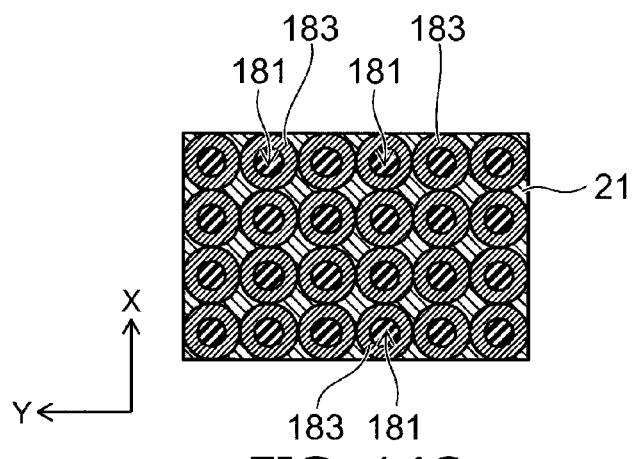

FIGS. 14A to 14C is a schematic view illustrating the process of manufacturing a non-volatile memory device according to a second embodiment. FIG. 14A is a top view illustrating the groove 77 that divides the first layer 120 and the second layer 130, and through holes 177 formed so as to pierce the first layer 120. FIG. 14B is a cross-sectional view along the line H-H depicted in FIG. 14A.

FIG. 14C is a cross-sectional view along the line J-J depicted in FIG. 14B, illustrating a memory cell array 2 after siliciding the word lines 21.

The memory cell array 2 of the non-volatile memory device according to the embodiment includes, for example, the first layer 120 provided on the conductive film 15, and the second layer 130 selectively provided on the first layer 120. The first layer 120 includes the plurality of first conductive films (word lines 21), and the plurality of first insulating films (insulating film 25), and each of the word lines 21 and each of the insulating films 25 are disposed alternately in the Z-direction. The second layer includes the second conductive film (selection gate 31).

The memory cell array 2 further includes the semiconductor pillars 43 that pierce through the first layer 120 and the second layer 130. The memory film 47 is provided between the semiconductor pillars 43 and the first layer 120 (see FIG. 1).

In the memory region in which the semiconductor pillars 43 is provided, the second insulating film (insulating film 27) is provided between two adjacent semiconductor pillars 43, dividing the first layer 120 and the second layer 130. In addition, the through holes 177 are provided in portions 171 and 173 of the first layer 120 located around the memory region. Also, a fourth insulating film (insulating film 181) is provided filling the through holes 177. The word lines 21 include silicided portions 83 (see FIG. 10A), 183 on the end portions in contact with the insulating film 27 and the insulating film 181.

In the embodiment, the mask (see FIG. 9A) for forming the groove 77 includes a plurality of openings in the first portion 80a and the second portion 80b. Therefore, as illustrated in FIGS. 14A and 14B, while forming the groove 77, the through holes 177 are simultaneously formed, which pierce the second layer 130 and the first layer 120 through the opening. Then, as illustrated in FIG. 14C, it is possible to silicide the word lines 21 on the inside of each through holes 177. In this way, it is possible to further reduce the electrical resistance of the word lines 21.

The memory cell array 2 further includes the interconnection layer 50 provided on the second layer 130 and the insulating film 75 (see FIG. 11). The interconnection layer 50 includes the interconnections 87, 88, and 89. For example, the word lines 21 are connected to any one of the interconnections 87 via the plug 91. Then, the plug 91 contacts any one of the word lines 21 at a portion 179 where the through hole 177 is not provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for fabricating a pattern, comprising:
   forming a mask covering a first layer, and a second layer selectively provided on the first layer, the mask including,
      a first portion formed on a region of the first layer on a first side of the second layer,
      a second portion formed on a region of the first layer on a second side of the second layer opposite to the first side,
      a plurality of first extending parts extending over the second layer from the first portion toward the second portion, and
      a plurality of second extending parts extending over the second layer from the second portion toward the first portion, each of the second extending parts being located between two adjacent first extending parts, and the first extending parts and the second extending parts being disposed alternately; and
   forming a groove dividing the first layer and the second layer by selectively etching the first layer and the second layer using the mask.

2. A method of manufacturing a non-volatile memory device, the method comprising:
   forming a first layer including a plurality of first conductive films and a plurality of first insulating films, each of the first conductive films and each of the first insulating films being stacked alternately on a underlying layer;
   selectively forming a second layer on the first layer, the second layer including a second conductive film;
   forming a mask covering the first layer, and the second layer, the mask including,
      a first portion formed on a region of the first layer located on a first side of the second layer,
      a second portion formed on a region of the first layer located on a second side of the second layer opposite to the first side,
      a plurality of first extending parts extending over the second layer from the first portion toward the second portion, and
      a plurality of second extending parts extending over the second layer from the second portion toward the first portion, each of the second extending parts being located between two adjacent first extending parts, and the first extending parts and the second extending parts being disposed alternately; and
   forming a first groove dividing the first layer and the second layer by selectively etching the first layer and the second layer using the mask.

3. The method according to claim 2, further comprising:
   forming silicided portions at an end of each first conductive film and an end of the second conductive film exposed inside the first groove.

4. The method according to claim 3, further comprising:
   forming a second insulating film filling the inside of the first groove.

5. The method according to claim 2, further comprising:
   forming a pair of contact regions in the first layer, one of the contact regions being formed on the first side, and the other of the contact regions being formed on the second side,
   wherein each contact region includes a portion of each first conductive film exposed in a stairs form.

6. The method according to claim 5, further comprising:
   forming a third insulating film covering the contact region,
   wherein the mask is formed on the third insulating film and the second layer.

7. The method according to claim 2, further comprising:
   forming a plurality of through holes piercing through the second layer and the first layer;
   forming a memory film on the inner face of each of the plurality of through holes, and
   forming a semiconductor film on the memory film inside each of the plurality of through holes,
   wherein the first extending parts cover a first portion of the plurality of through holes, and the second extending parts cover a second portion of the plurality of through holes.

8. The method according to claim 7, further comprising:
   forming a third layer on the underlying layer, the third layer including a connection part that connects semiconductor films provided in two adjacent through holes,
   wherein the first layer is formed on the third layer.

9. The method according to claim 8, further comprising:
   forming a fourth layer on the third layer, the fourth layer serving as an etching stop layer while etching the first layer,
   wherein the first layer is formed on the fourth layer.

10. The method according to claim 8, wherein the first groove is formed between the two adjacent through holes.

11. The method according to claim 10, further comprising:
   forming a second groove dividing the second conductive film in a space between another two adjacent through holes, wherein a connection part is not formed in the space.

12. The method according to claim 11, further comprising:
   forming silicided portions at ends of each first conductive film and the second conductive film exposed inside the first groove and the second groove.

13. The method according to claim 7, wherein the first conductive film, the second conductive film, and the semiconductor film are formed so as to include conductive polycrystalline silicon.

14. The method according to claim 2, further comprising:
forming a plurality of through holes in the first portion and the second portion through openings provided in the mask, while forming the first groove,
forming silicided portions at ends of each first conductive film exposed inside the first groove and the through holes.

* * * * *